United States Patent [19]

Peterson et al.

[11] Patent Number: 4,954,872

[45] Date of Patent: Sep. 4, 1990

[54] ELECTRICAL CONTACT STABILIZER ASSEMBLY

[75] Inventors: Richard W. Peterson, Utica; Charles J. Malo, Frazer, both of Mich.

[73] Assignee: Altair International, Inc., Mt. Clemens, Mich.

[21] Appl. No.: 188,373

[22] Filed: Apr. 29, 1988

[51] Int. Cl.⁵ .................. H01L 23/48; H01L 23/50
[52] U.S. Cl. ........................................ 357/70; 357/68
[58] Field of Search .......................... 357/70, 68, 74

[56] References Cited

U.S. PATENT DOCUMENTS

| | | | |
|---|---|---|---|
| 3,753,054 | 8/1973 | Johnson | 357/74 |
| 4,329,642 | 5/1982 | Luthi et al. | 357/70 |
| 4,381,131 | 4/1983 | Demnianiuk | 357/74 |
| 4,672,418 | 6/1987 | Moran et al. | 357/70 |

Primary Examiner—Rolf Hille
Assistant Examiner—S. V. Clark
Attorney, Agent, or Firm—Weingarten, Schurgin, Gagnebin & Hayes

[57] ABSTRACT

An electrical contact stabilizer assembly includes support and positioning means to sandwich an electronic leadframe between opposing interconnecting members which maintain the contact leads of the leadframe in predetermined spaced relationship during the molding process by which the leadframe is encapsulated in a housing. Opposing members are integrally formed of an insulative material and include cooperative connecting means and spacers to hold the contact leads in the intended spaced relation to each other.

13 Claims, 7 Drawing Sheets

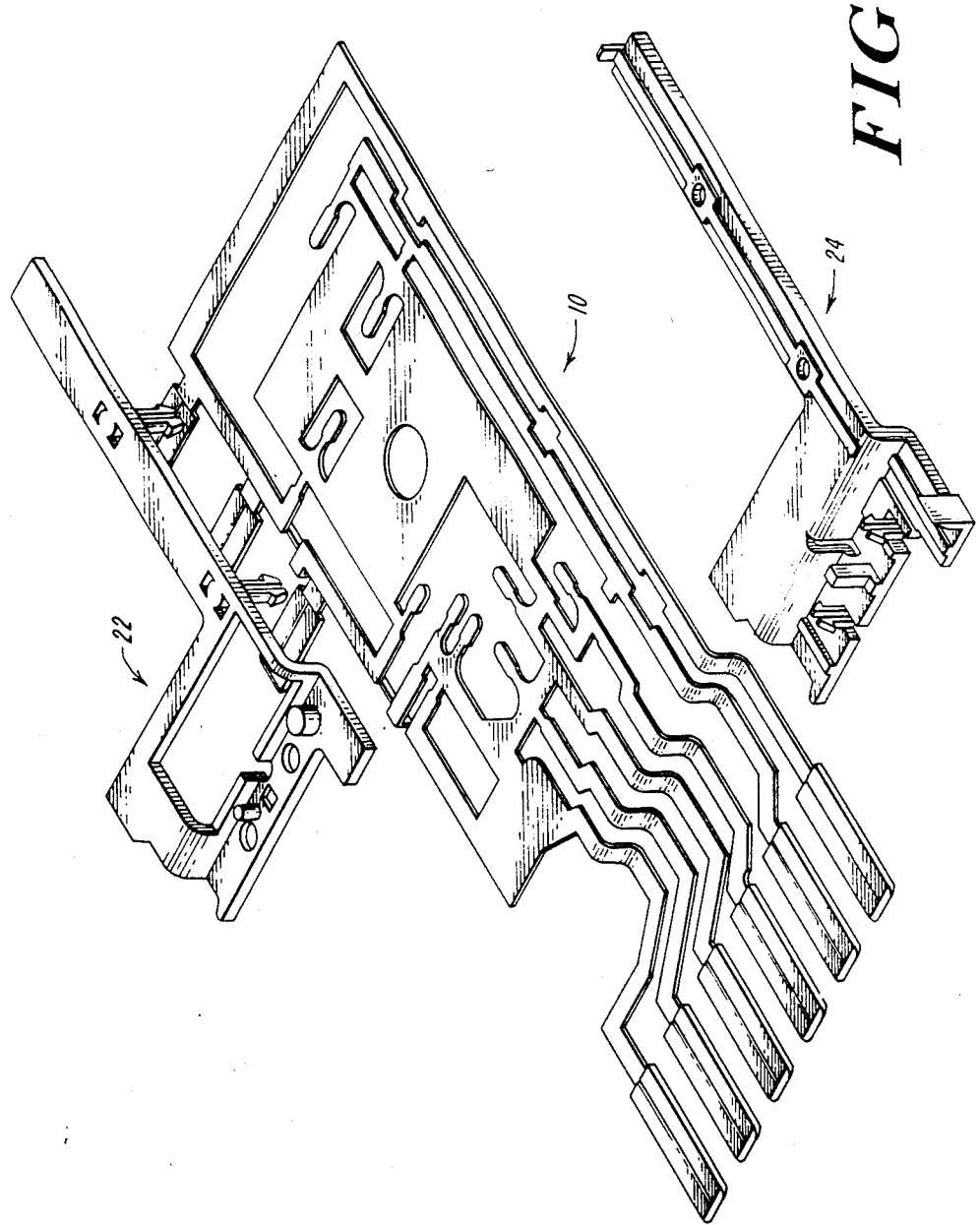

4,954,872

ELECTRICAL CONTACT STABILIZER ASSEMBLY

FIELD OF THE INVENTION

This invention relates to electrical contact assemblies and more particularly to the support and positioning of a plurality of contacts.

BACKGROUND OF THE INVENTION

It is well known to provide a plurality of leads on a lead frame and to encapsulate such leads in a plastic housing. Typically, an electronic circuit, such as a thick film hybrid circuit, is mounted on the leadframe prior to encapsulation. During the encapsulating process, the leads are often subject to forces which result in the leads becoming mis-aligned, deformed or out of relative position with respect to each other. As a result, the leads do not correctly align with mating contacts of an associated device. In prior attempts to avoid such mis-alignment, the leads of a lead frame have been pre-molded with a plastic member intended to position the leads in intended alignment. The lead frame with the pre-molded member is thereafter fully molded into a completed housing. This pre-molding operation does not wholly eliminate the problem of mis-alignment as the pre-molding process itself can cause mis-alignment of the leads.

SUMMARY OF THE INVENTION

In brief, the present invention provides a support and positioning means for the plural leads of a lead frame. The present invention accurately positions the leads relative to each other and maintains precise alignment of the leads during the encapsulating molding process. The support and positioning means comprises first and second integral insulative members, preferably formed of a molded plastic, and having constituents cooperative with portions of the lead frame and also cooperative with portions of the other member to sandwich and secure the leads in intended aligned position when the insulative members are snapped together. This assembly, formed by the lead frame and the cooperative support members, is then molded into a housing and does not suffer the deleterious consequences of mis-alignment of the leads occasioned by the molding process.

BRIEF DESCRIPTION OF THE DRAWINGS

A more complete understanding of the invention and its various features, objects, and advantages may be obtained from the following detailed description when taken in conjunction with the attached drawings in which:

FIG. 2 is an exploded view of the opposing members of the present invention and an electronic leadframe;

DETAILED DESCRIPTION

Figure 1:
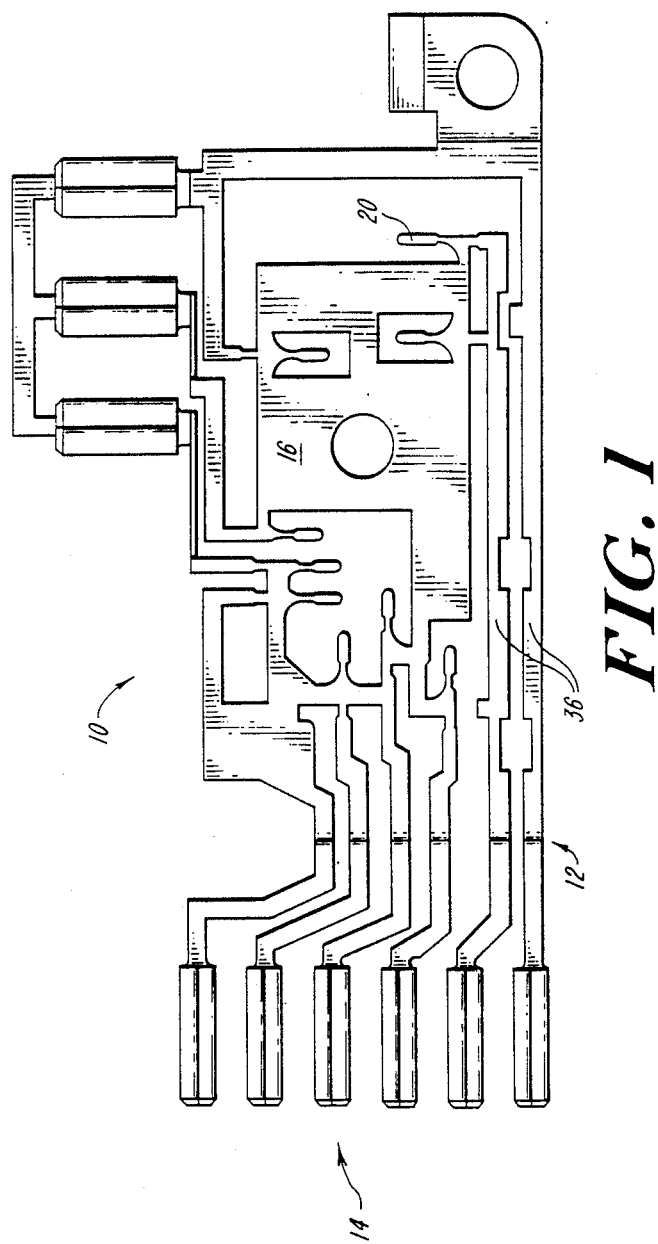
FIG. 1 is a top view of a typical electronic lead frame.

The electronic leadframe 10 of FIG. 1 includes a plurality of leads 12 each terminating in a respective contact 14. The leadframe is formed of a conductive metal or alloy and has a central portion 16 and a plurality of contact pads 20 for connection to corresponding contact points on an electronic device such as a thick film hybrid circuit.

FIG. 2 illustrates the leadframe 10 of FIG. 1 and the opposing members 22, 24 of the present invention in exploded view. Opposing members 22, 24 are molded to accept the lead frame 10 in snug-fit when the leadframe 10 is sandwiched therebetween.

Figure 3A:
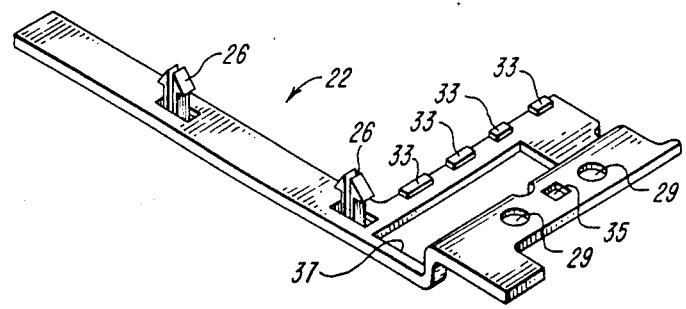
FIGS. 3A and 3B are pictorial views of the opposing members of the present invention.
Figure 3B:
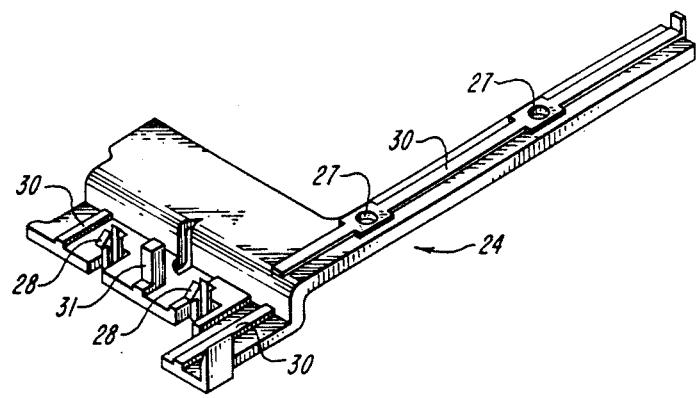

FIGS. 3A and 3B illustrate opposing members 22,24 respectively. Integrally formed press-fit connectors 26,28 are cooperative with apertures 27 and 29 respectively to interconnect opposing members 22,24 with leadframe 10 securely held in position therebetween. Integrally formed spacers 30 and 33 and spacing boss 31 are dimensioned for insertion between selected portions of contact leads 12 to maintain contact leads 12 in predetermined spaced relationship when opposing members 22,24 are interconnectably mounted on leadframe 10. Aperture 35 of opposing member 22 is dimensioned to receive spacing boss 31 to enhance the stability of the assembly. Orifice 37 in opposing member 22 and orifice 39 in opposing member 24 allow flow-through of molten plastic during the final encapsulation of the assembly into its housing.

Figure 4:
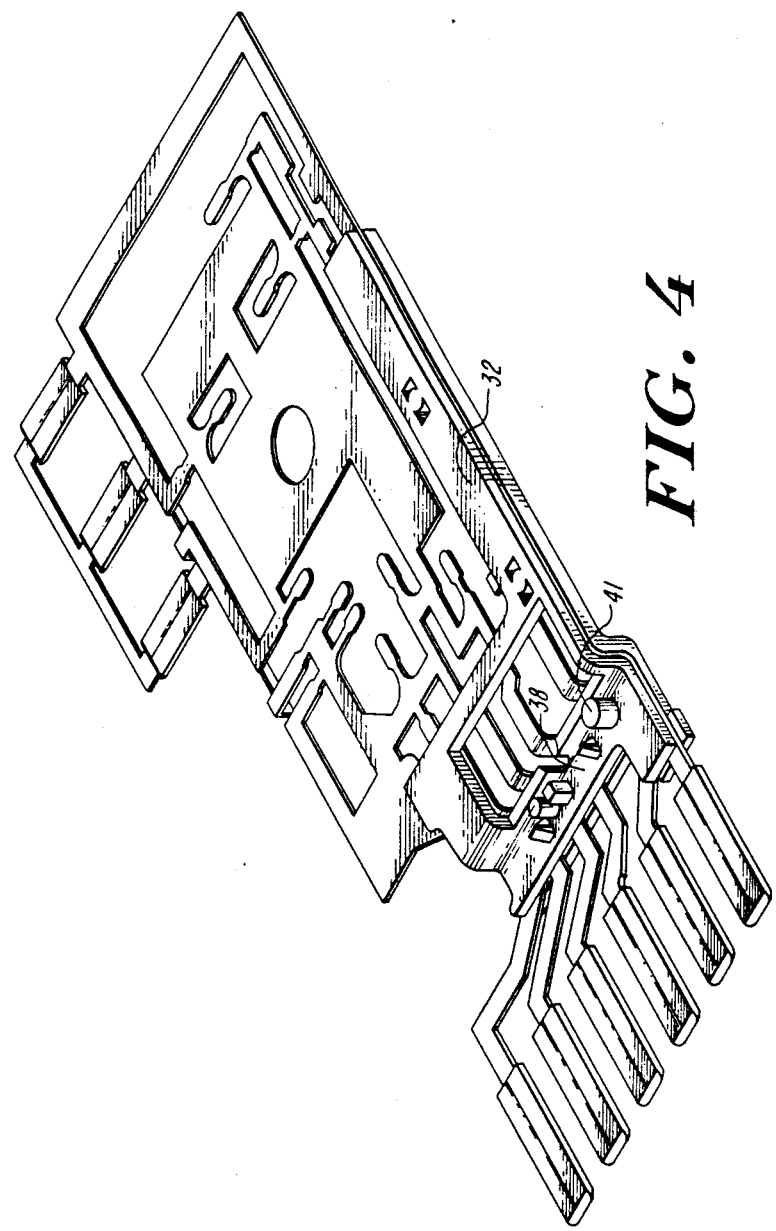
FIG. 4 is a top perspective view of the members of the present invention connected to the leadframe.
Figure 5:
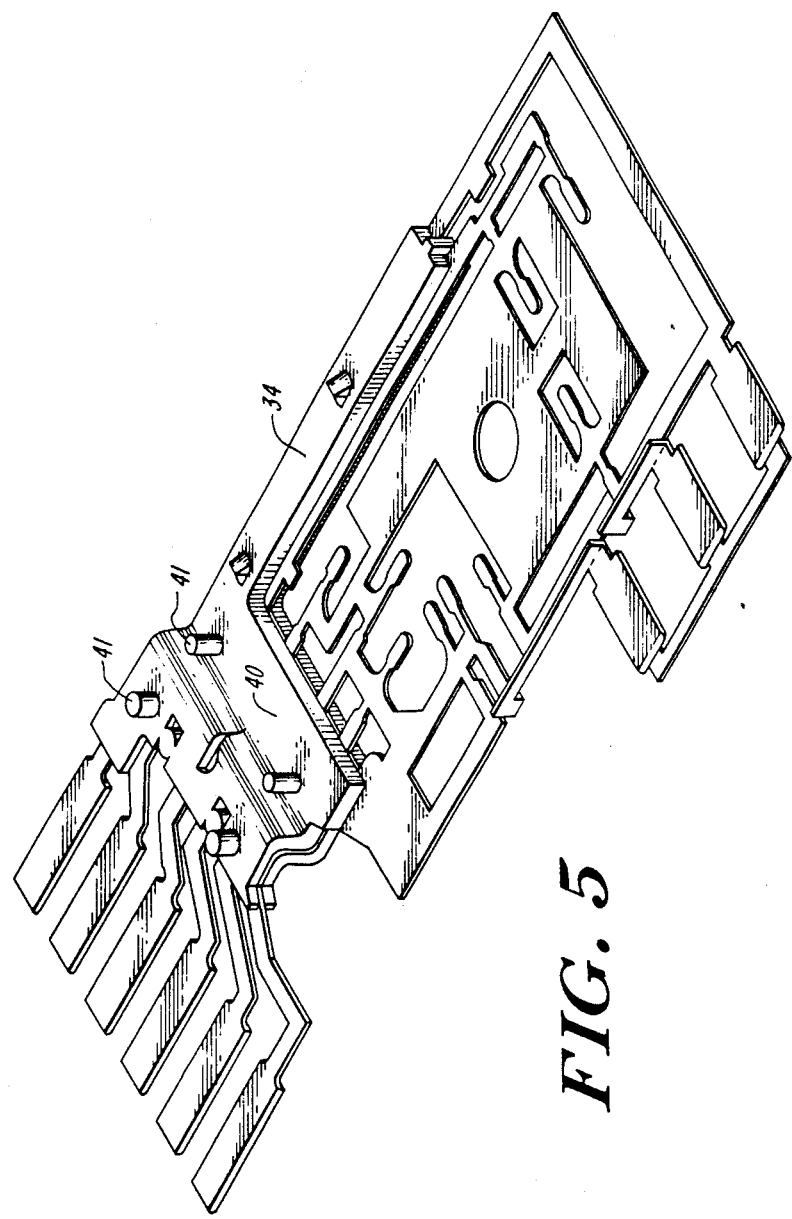
FIG. 5 is a bottom perspective view of the members of the Present invention connected to the leadframe.

FIGS. 4 and 5 illustrate leadframe 10 and opposing members 22,24 after assembly. In the embodiment illustrated, opposing members include opposing elongated stabilizers 32,34 which hold flimsy lengths of contact leads 36, illustrated in FIG. 1, in stable spaced relation to each other. Opposing end sections 38,40 maintain the array of contact leads 12 in predetermined stable spaced relation to each other. Integral stand-off bosses 41 conform to top and bottom halves of the mold tool (not shown) and prevent mold squeeze, thereby reducing the likelihood of leadframe deformation during assembly.

Figure 6:
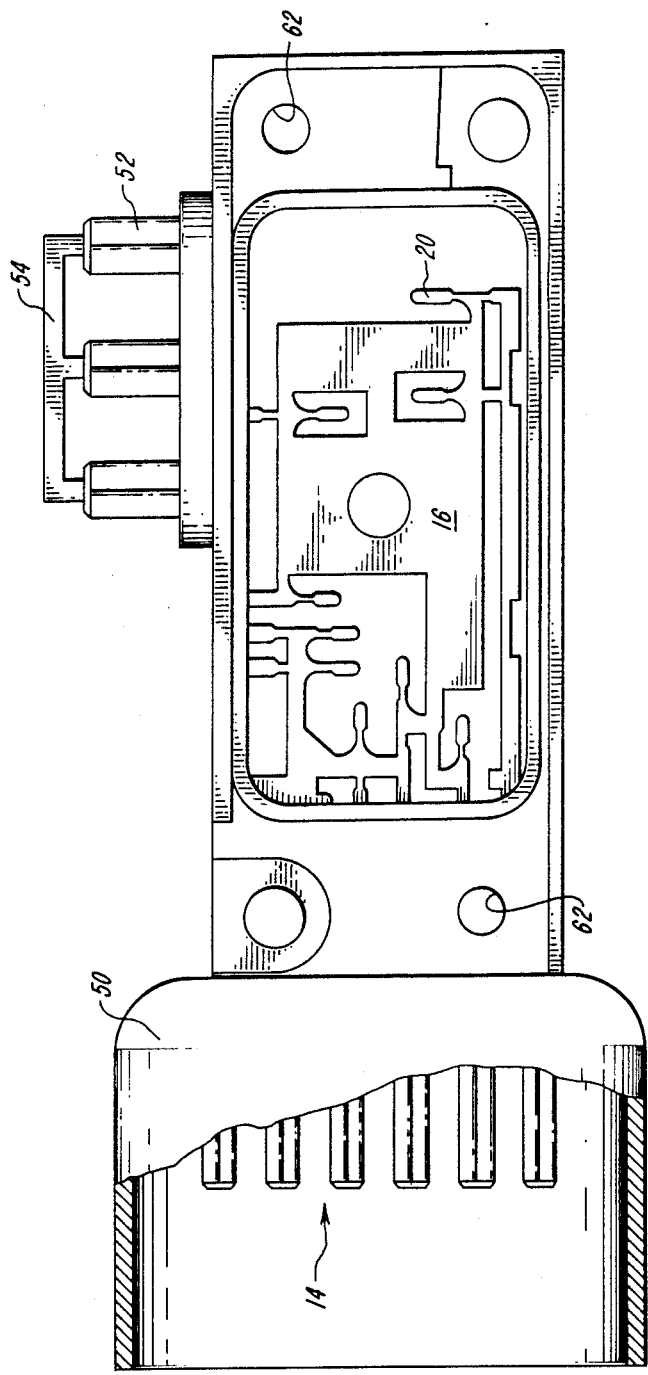
FIG. 6 is a top view, partly cutaway, of the leadframe and supporting members encapsulated in the housing.

FIG. 6 illustrates the assembled leadframe and opposing members after encapsulation into housing 50. Part of the housing has been cut away to illustrate the array of contacts 14 which have survived the encapsulation process, typically plastic injection molding, in intended predetermined spaced relation. By maintaining the intended spacing between adjacent contact leads 12, and between adjacent contacts 14, opposing members 22,24 of the present invention prevent electrical shorts between leads 12 and contacts 14 and ensure that contacts 14 are correctly positioned for interconnection with mating contacts of an associated device.

In the embodiment illustrated in FIG. 6, leadframe 10 comprises three pins 52 which are interconnected by tie bar 54. After leadframe 10 is encapsulated into housing 50, tie bar 54 is removed to expose pins 52 for connection to an associated electrical component. In addition, cuts are made either before or after the encapsulating process, for example along the dotted lines shown in FIG. 6, and central portion 16 is removed permitting connection of contact pads 20 to an electronic device.

Figure 7:
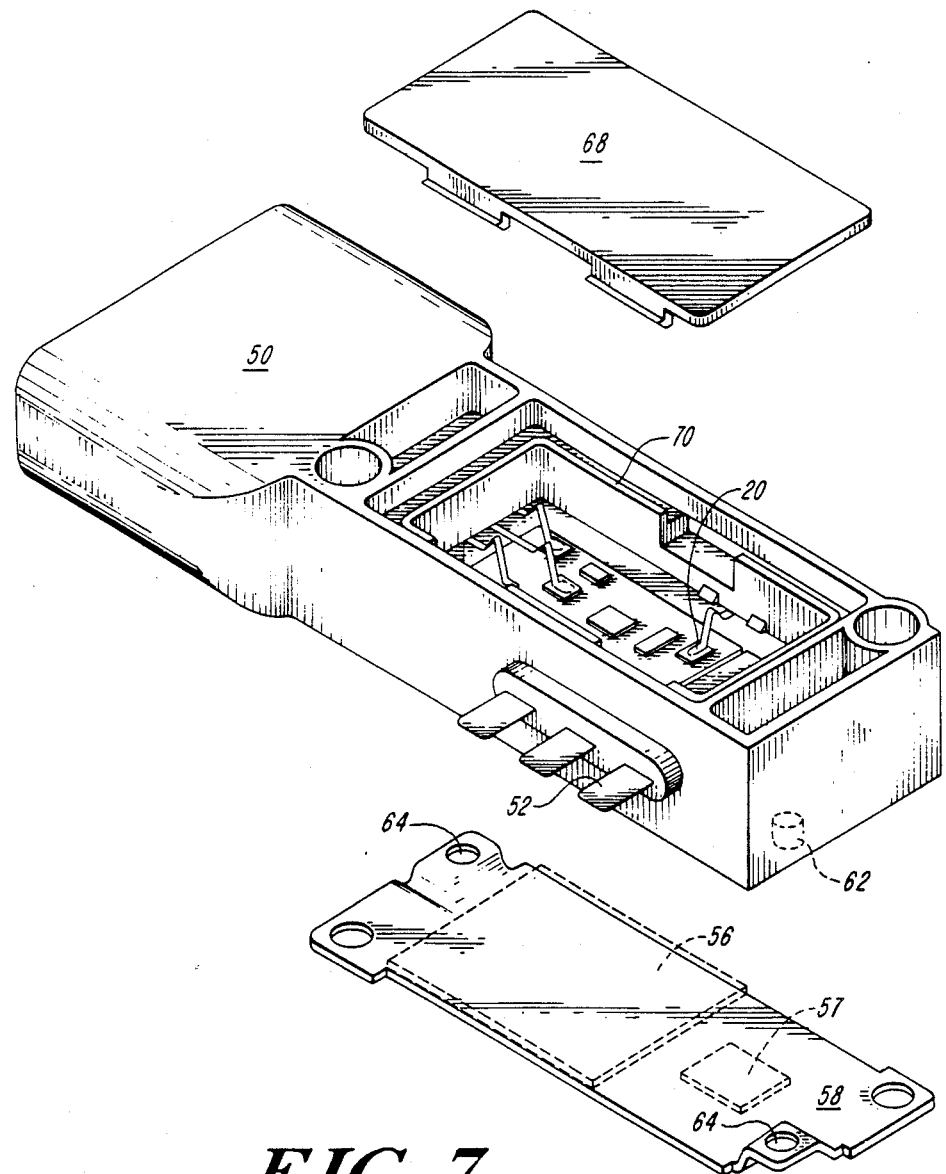
FIG. 7 is an exploded view of the base plate and cover of the molded housing containing a thick film circuit.

Referring now to FIG. 7, film circuits are disposed at sites 5, 6, and 54 on base plate 58. The base plate is mounted to housing 50, with the circuits 66 (only one being visible) disposed in the cavity of the housing. The base plate 58 is retained on the housing 50 by cooperative heat strokes 62 (also shown in FIG. 6) and apertures 64. Other featuring means can be employed to secure the base plate to the housing.

Film circuit 66 is illustrated connected to housing 50. Contact pads 20 have been bent for electrical connection to intended contacts of film circuit 66. After electrical connection between contact pads 20 and film circuit 66 has been achieved, the surface of film circuit 66 and contact pads 20 may be covered with a potting material or seal gel to reduce the likelihood of disconnection during handling and use. Cover 68 is connectably mounted on lip 70 of housing 50 to enclose film circuit 66 within housing 50. Pins 52 are shown with tie-bar 54 removed.

Having above indicated a preferred embodiment of the present invention, it will occur to those skilled in the art that modifications and alternatives can be practiced within the spirit of the invention. It is accordingly intended to define the scope of the invention only as indicated in the following claims.

What is claimed is:

1. An electrical contact assembly comprising:
    a leadframe having at least one plurality of leads disposed in spaced relationship each terminating at one end in a respective contact, and terminating at an opposite end in a plurality of contact fingers at a site for mounting an electronic circuit to which the leads are connected;
    a first integral member of electrically insulative material including:
      an end section;
      a stabilizer extending from said end section; and
      at least one connecting element
    a second integral member of electrically insulative material including:
      an end section;
      a stabilizer extending from said end section;
      at least one integrally formed raised element extending from said end section and dimensioned for insertion between selected adjacent ones of said plurality of leads;
      an integrally formed ridge extending substantially the length of said stabilizer and dimensioned for insertion between selected adjacent ones of said plurality of leads; and
      at least one connecting element cooperative with said at least one connecting element of said first integral member to interconnect said first and second integral members with said leadframe sandwiched therebetween.

2. The electrical contact assembly of claim 1 wherein said leadframe further includes at least one detent in at least one of said plurality of leads for receiving at least a portion of one of said second integral member raised elements or ridge.

3. The electrical contact assembly of claim 1 wherein said first and second integral member connecting elements include interlocking male and female connecting elements.

4. The electrical contact assembly of claim 3 wherein said female connecting elements include male connecting element receiving apertures and said male connecting elements include locking detents cooperative with said female connecting element receiving apertures to maintain each of said female elements in locking engagement with a respective corresponding male element.

5. The electrical contact assembly of claim 1 wherein selected ones of said plurality of contacts depend from said leadframe.

6. The electrical contact assembly of claim 1, wherein at least one of said first and second integral members further includes at least one integral stand-off boss.

7. The electrical contact assembly of claim 1, wherein at least one of said first and second integral members further includes an aperture to permit flow of a molten plastic material.

8. The electrical contact assembly of claim 1 wherein said first integral member further includes at least one aperture dimensioned to receive a corresponding one of said at least one integrally formed raised elements of said second integral member.

9. The electrical contact assembly of claim 1 wherein said first and second integral member end sections are disposed substantially perpendicularly to said first and second integral member stabilizers respectively.

10. The electrical contact assembly of claim 1 wherein said first integral member further includes at least one integrally formed raised element extending from said first integral member end section and dimensioned for insertion between selected adjacent ones of said plurality of leads.

11. An electrical contact assembly for positioning a plurality of leadframe leads relative to each other, the assembly comprising:
    an electrically conductive leadframe having a predetermined thickness and including a plurality of leads;
    a first member integrally formed of an electrically insulative material including at least one raised spacing element protruding therefrom, said raised spacing element having a predetermined height not exceeding the predetermined thickness of the leadframe and dimensioned for insertion between selected ones of the plurality of leadframe leads;
    a second member integrally formed of an electrically insultating material;
    means for securing said first integral member to said second integral member with a portion of said leadframe sandwiched therebetween and with said at least one raised spacing element in inserted position between selected ones of the plurality of leadframe leads.

12. The electrical contact assembly of claim 11 wherein said securing means comprise interlocking male and female members.

13. The electrical contact assembly of claim 11 wherein said first and second integral members each include an elongated section extending therefrom at least one of said elongated sections having a raised spacing element protruding therefrom, said raised spacing element dimensioned for insertion between selected ones of the plurality of leadframe leads.

* * * * *